(12) United States Patent
Wang

(10) Patent No.: US 8,803,250 B2
(45) Date of Patent: Aug. 12, 2014

(54) METAL-OXIDE-SEMICONDUCTOR FIELD-EFFECT TRANSISTOR AND METHOD FOR MANUFACTURING THE SAME

(75) Inventor: Le Wang, Wuxi (CN)

(73) Assignees: CSMC Technologies FAB1 Co., Ltd., Wuxi (CN); CSMC Technologies FAB2 Co., Ltd., Wuxi (CN)

( * ) Notice: Subject to any disclaimer, the term of this patent is extended or adjusted under 35 U.S.C. 154(b) by 116 days.

(21) Appl. No.: 13/807,308

(22) PCT Filed: Nov. 18, 2011

(86) PCT No.: PCT/CN2011/082406
§ 371 (c)(1),
(2), (4) Date: Dec. 28, 2012

(87) PCT Pub. No.: WO2012/071988
PCT Pub. Date: Jun. 7, 2012

(65) Prior Publication Data
US 2013/0113052 A1    May 9, 2013

(30) Foreign Application Priority Data
Nov. 29, 2010    (CN) .......................... 2010 1 0564174

(51) Int. Cl.
H01L 29/02 (2006.01)
H01L 29/66 (2006.01)
H01L 29/78 (2006.01)
H01L 29/10 (2006.01)

(52) U.S. Cl.
CPC .......... *H01L 29/78* (2013.01); *H01L 29/66477* (2013.01); *H01L 29/1033* (2013.01); *H01L 29/66651* (2013.01)

USPC ........................................... 257/402; 438/289

(58) Field of Classification Search
None
See application file for complete search history.

(56) References Cited

U.S. PATENT DOCUMENTS 7,683,436 B2 * 3/2010 Nishiyama et al. ........... 257/401

* cited by examiner

*Primary Examiner* — Julio J Maldonado
*Assistant Examiner* — Robert Bachner
*(74) Attorney, Agent, or Firm* — Anova Law Group, PLLC

(57) ABSTRACT

A Metal-Oxide-Semiconductor Field Effect Transistor (MOSFET) is disclosed. The MOSFET includes a substrate, a well region formed in the substrate, a shallow channel layer, a channel, a gate oxide layer, a gate region, a source region, and a drain region. The shallow channel layer is formed on a portion of the well region and includes a first shallow channel region and a second shallow channel region. The channel is arranged between the first shallow channel region and the second shallow channel region and connects the first shallow channel region and the second shallow channel region. Further, the gate oxide layer is formed on a portion of the well region between the first shallow channel region and the second shallow channel region and includes a first gate oxide region and a second gate oxide region arranged on different sides of the channel. The gate region is formed on the channel and the gate oxide layer; the source region is formed in the first shallow channel region and vertically extends into the well region under the first shallow channel region; and the drain region is formed in the second shallow channel region and vertically extends into the well region under the second shallow channel region.

17 Claims, 8 Drawing Sheets

METAL-OXIDE-SEMICONDUCTOR FIELD-EFFECT TRANSISTOR AND METHOD FOR MANUFACTURING THE SAME

CROSS-REFERENCES TO RELATED APPLICATIONS

This application claims the priority of Chinese patent application no. 201010564174.2, filed on Nov. 29, 2010, the entire contents of which are incorporated herein by reference.

FIELD OF THE INVENTION

The present invention generally relates to the field of semiconductor manufacturing and, more particularly, to Metal-Oxide-Semiconductor Field-Effect Transistor (MOSFET) technologies.

BACKGROUND

Significant progresses have been made on the performance of semiconductor microchips since the small-scale integration in the early 1960s. One of the common indicators of performance is chip speed. Smaller critical dimension (CD) of the semiconductor devices allows more semiconductor devices within a same chip, which leads to a shortened signal transmission distance in circuits and an improved chip speed. Furthermore, smaller-sized semiconductor devices result in smaller microchip packages, and smaller-sized electronic products are more convenient for everyday carrying and use. Therefore, it is an important developing trend in semiconductor fabrication to manufacture semiconductor devices with smaller sizes.

However, the increasingly smaller size of semiconductor devices has brought along some unfavorable factors. For example, firstly, continuous decrease in the gate oxide thickness of MOSFETs may cause problems such as decreased breakdown voltage of the gate oxide. Secondly, continuous decrease in channel length may cause the effect of drain-induced barrier lowering, which largely reduces the controllability of the gate and increases the leakage current. Finally, as the size of the MOSFET decreases, the threshold voltage also decreases, which calls for more accurate control of the carrier concentration in the channel.

The disclosed methods and systems are directed to solve one or more problems set forth above and other problems.

BRIEF SUMMARY OF THE DISCLOSURE

One aspect of the present disclosure includes a Metal-Oxide-Semiconductor Field Effect Transistor (MOSFET). The MOSFET includes a substrate, a well region formed in the substrate, a shallow channel layer, a channel, a gate oxide layer, a gate region, a source region, and a drain region. The shallow channel layer is formed on a portion of the well region and includes a first shallow channel region and a second shallow channel region. The channel is arranged between the first shallow channel region and the second shallow channel region and connects the first shallow channel region and the second shallow channel region. Further, the gate oxide layer is formed on a portion of the well region between the first shallow channel region and the second shallow channel region and includes a first gate oxide region and a second gate oxide region arranged on different sides of the channel. The gate region is formed on the channel and the gate oxide layer; the source region is formed in the first shallow channel region and vertically extends into the well region under the first shallow channel region; and the drain region is formed in the second shallow channel region and vertically extends into the well region under the second shallow channel region.

Another aspect of the present disclosure includes a method for manufacturing a Metal-Oxide-Semiconductor Field Effect Transistor (MOSFET). The method includes providing a substrate, forming a well region in the substrate, and forming a shallow channel layer on a portion of the well region. The shallow channel layer includes a first shallow channel region and a second shallow channel region. The method also includes forming a channel between the first shallow channel region and the second shallow channel region, and the channel connects the first shallow channel region and the second shallow channel region. Further, the method includes forming a gate oxide layer on a portion of the well region between the first shallow channel region and the second shallow channel region, and the gate oxide layer includes a first gate oxide region and a second gate oxide region arranged on different sides of the channel. The method also includes forming a gate region on the channel and the gate oxide layer, forming a source region in the first shallow channel region and the well region under the first shallow channel region, and forming a drain region in the second shallow channel region and the well region under the second shallow channel region.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
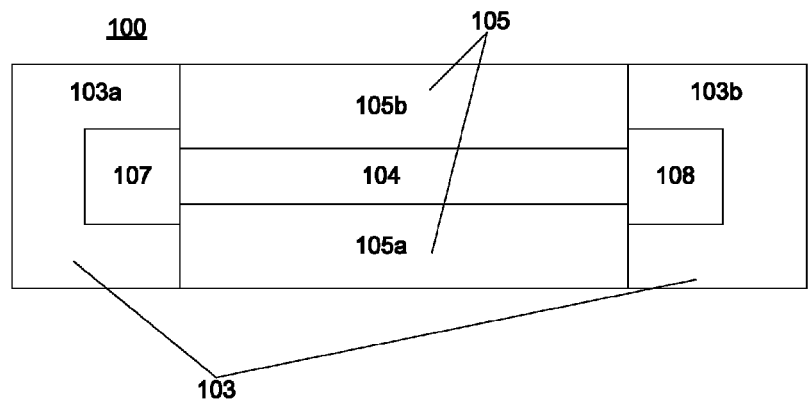
FIG. 1 is a top view of a MOSFET consistent with the disclosed embodiments.
Figure 2:
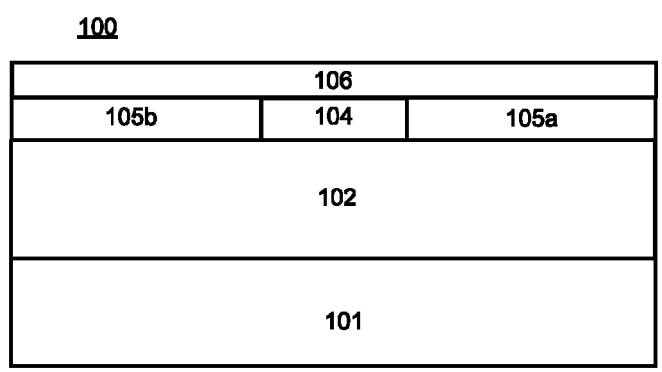
FIG. 2 is a cross-section view of the MOSFET consistent with the disclosed embodiments.

FIG. 1 and FIG. 2 show a top view and a cross-section view of a MOSFET 100, respectively. As shown FIG. 1 and FIG. 2, the MOSFET 100 includes a substrate 101 and a well region 102. The well region 102 is formed in the substrate 101. The MOSFET 100 also includes a shallow channel layer 103, formed on a portion of the well region 102. The shallow channel layer 103 includes a first shallow channel region 103a and a second shallow channel region 103b.

Further, the MOSFET 100 includes a channel 104, formed on a portion of the well region 102 and may be on the same layer level as the shallow channel layer 103. More specifically, the channel 104 is formed on the portion of the well region 102 between the first shallow channel region 103a and the second shallow channel region 103b.

The MOSFET 100 also includes a gate oxide layer 105. The gate oxide layer 105 is formed on a portion of the well region 102 and on the same layer level as the shallow channel layer 103 and the channel 104. Specifically, the gate oxide layer 105 is formed on the portion of the well region 102 between the first shallow channel region 103a and the second shallow channel region 103b. Further, the gate oxide layer 105 includes a first gate oxide region 105a and a second gate oxide region 105b arranged on respective sides of the channel 104.

Further, the MOSFET 100 includes a gate region 106, a source region 107, and a drain region n108. The gate region 106 is formed on the channel 104 and the gate oxide 105. The source region 107 is formed in the first shallow channel region 103a and the well region 102 under the first shallow channel region 103a. Further, the drain region n108 is formed in the second shallow channel region 103b and the well region 102 under the first shallow channel region 103b.

The substrate 101 may include any appropriate material for making double-gate structures. For example, the substrate 101 may include a semiconductor structure, e.g., silicon, silicon germanium (SiGe) with a monocrystalline, polycrystalline, or amorphous structure. The substrate 101 may also include a hybrid semiconductor structure, e.g., carborundum, indium antimonide, lead telluride, indium arsenide, indium phosphide, gallium arsenide or gallium antimonide, alloy semiconductor, or a combination thereof. Further, the substrate 101 may include a silicon-on-insulator (S01) structure. In addition, the substrate 101 may also include other materials, such as a multi-layered structure of epitaxial layer or buried layer. Other materials may also be used.

The MOSFET 100 may be an N-channel MOSFET or a P-channel MOSFET. Thus, the well region 102 may be P-type doped or N-type doped based on the type of MOSFET. Further, the well region 102 may be formed by first forming a photoresist pattern of the well region 102 on the surface of the substrate 101 or the epitaxial layer of the substrate 101 by photolithography, and then forming the well region 102 by ion implantation with boron or phosphorous using the photoresist pattern as a mask. Other ions may also be used.

The channel 104 and the shallow channel layer 103 may be formed by a same epitaxy method. Specifically, the shallow channel layer 103 may be obtained by selective epitaxial growth, photolithography or etching on the surface of the well region 102. The channel 104 may be part of the shallow channel layer 103, and formed on the well region 102 between the first shallow channel region 103a and the second shallow channel region 103b. The channel 104 may also connect the first shallow channel region 103a and the second shallow channel region 103b. Furthermore, the channel 104 and the shallow channel layer 103 may have the same doping status.

The gate oxide layer 105 may include at least silicon oxide. The first gate oxide region 105a and the second gate oxide region 105b may be obtained by forming a silicon oxide layer on the device surface by thermal oxidation and retaining those oxide regions on respective sides of the channel 104 by photolithography.

To form the gate region 106, a polysilicon layer is deposited on the device surface, and a gate pattern is formed by photolithography. The portion of the polysilicon layer that is outside the gate pattern is removed by corrosion, and the retained portion of the polysilicon layer is the polysilicon gate, which is the gate region 106. In certain embodiments, the polysilicon gate forming the gate region 106 covers the gate oxide layer 105 and the channel 104, i.e., between the first shallow channel region 103a and the second shallow channel region 103b. In certain other embodiments, the gate region 106 may include doped polysilicon, or a multi-layered structure including polysilicon and metallic silicide on the polysilicon.

Further, the source region 107 and the drain region 108 are formed in the first shallow channel region 103a and the second shallow channel region 103b on respective sides of the channel 104 and also in the well region 102. Both the source region 107 and the drain region 108 can be formed close to the channel 104, i.e., the channel 104 may connect the source region 107 and the drain region 108. The MOSFET 100 may also include a gate electrode, a source electrode and a drain electrode (not shown) that are obtained by forming a metal contact at the gate region, the source region and the drain region, respectively, and the details are omitted.

With the shallow channel layer 103, accurate control of the carrier concentration in the channel 104 can be achieved and the problem of decreased threshold voltage may be solved. Further, the longitudinal double gate oxide region structure (105a and 105b) can improve gate control efficiency, reduce leakage current and improve yield rate. The problem of decreased gate oxide breakdown voltage may also be solved. In addition, these structures may facilitate manufacturing smaller size MOSFETs.

Figure 3:
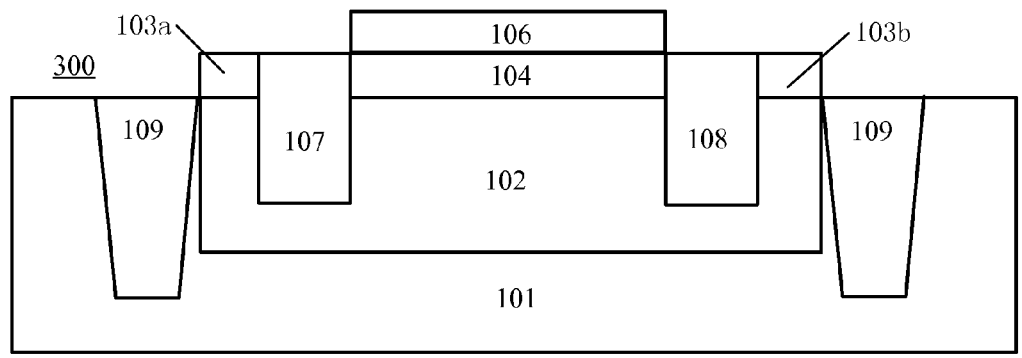
FIG. 3 is a cross-section view of another MOSFET consistent with the disclosed embodiments.

FIG. 3 is a cross-section view of another MOSFET consistent with the disclosed embodiments. As shown in FIG. 3, the structure of MOSFET 300 is similar to MOSFET 100 in FIG. 1 and FIG. 2, including the substrate 101, well region 102, shallow channel 103 (103a and 103b), channel 104, gate region 106, source region 107 and drain region 108. However, the MOSFET 300 also includes isolation regions 109 arranged in the substrate 101 and around the well region 102.

The isolation regions 109 are used to isolate different active regions, to prevent leakage current. The isolation regions 109 may be obtained by local oxidation, or the isolation regions 109 may be shallow trench isolations (STIs) obtained by a shallow trench isolation technique. The shallow trench isolations may be filled with an insulating material such as silicon oxide. Other materials and/or methods may also be used.

Figure 4A:
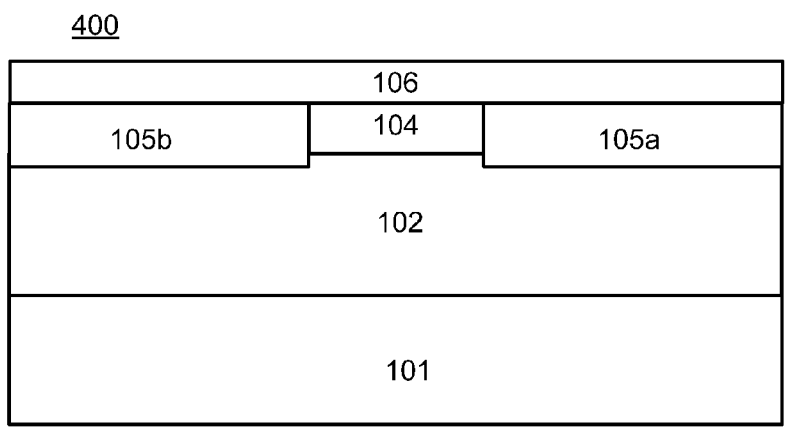
FIGS. 4a-4b are cross-section views of another MOSFET consistent with the disclosed embodiments.
Figure 4B:
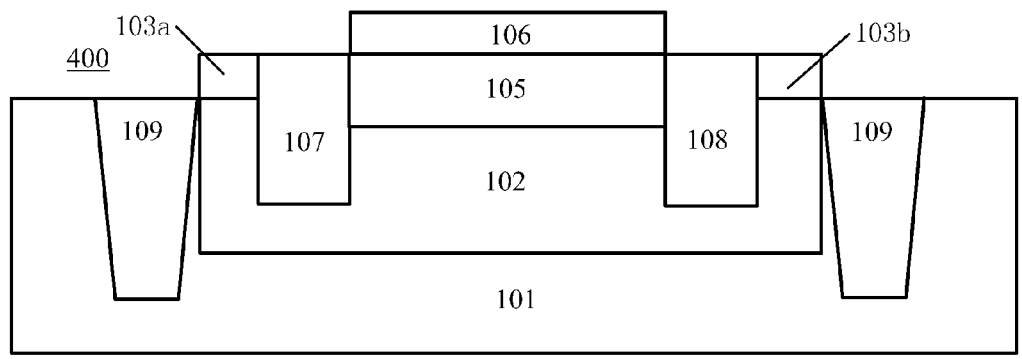

FIG. 4a is a longitudinal section-view of a gate oxide layer of a MOSFET 400, and FIG. 4b is a transverse section-view of the gate oxide layer of MOSFET 400. The structure of MOSFET 400 is similar to MOSFET 300 in FIG. 3, including the substrate 101, well region 102, shallow channel 103 (103a and 103b), channel 104, gate region 106, source region 107, drain region 108, and isolation regions 109. However, in MOSFET 400, the gate oxide layer 105 is partially in the well region 102. More specifically, before forming the gate oxide layer 105 by thermal oxidization, a predetermined region is oxidized such that the oxidization is extended into the well region 102. The oxide is then removed by etching, and a recess is formed in the predetermined region in the well region 102. Thus, the subsequent gate oxide layer 105 can be formed partially in the well region 102 by gate oxidization.

MOSFET 400 also has a structure in which the channel 104 between the longitudinal double oxide regions connects the source region 107 and the drain region 108. However, the difference in forming the gate oxide layer 105 may make MOSFET 400 differ from MOSFET 100 in certain ways. For example, in MOSFET 100, the gate oxide layer 105 is arranged on the surface of the well region 102, and may need to be a relatively thin in order to control the device size. Thus, the breakdown voltage may be reduced. However, in MOSFET 400, a portion of the well region 102 is eroded and the gate oxide layer 105 is formed in the portion of the well region 102, i.e., the gate oxide layer 105 is partially in the well region 102. Thus, the gate oxide layer 105 may be relatively thick while still effectively controlling the device size. This may solve the problem of decreased breakdown voltage caused by reduced gate oxide thickness in a smaller-sized MOSFET.

Figure 5:
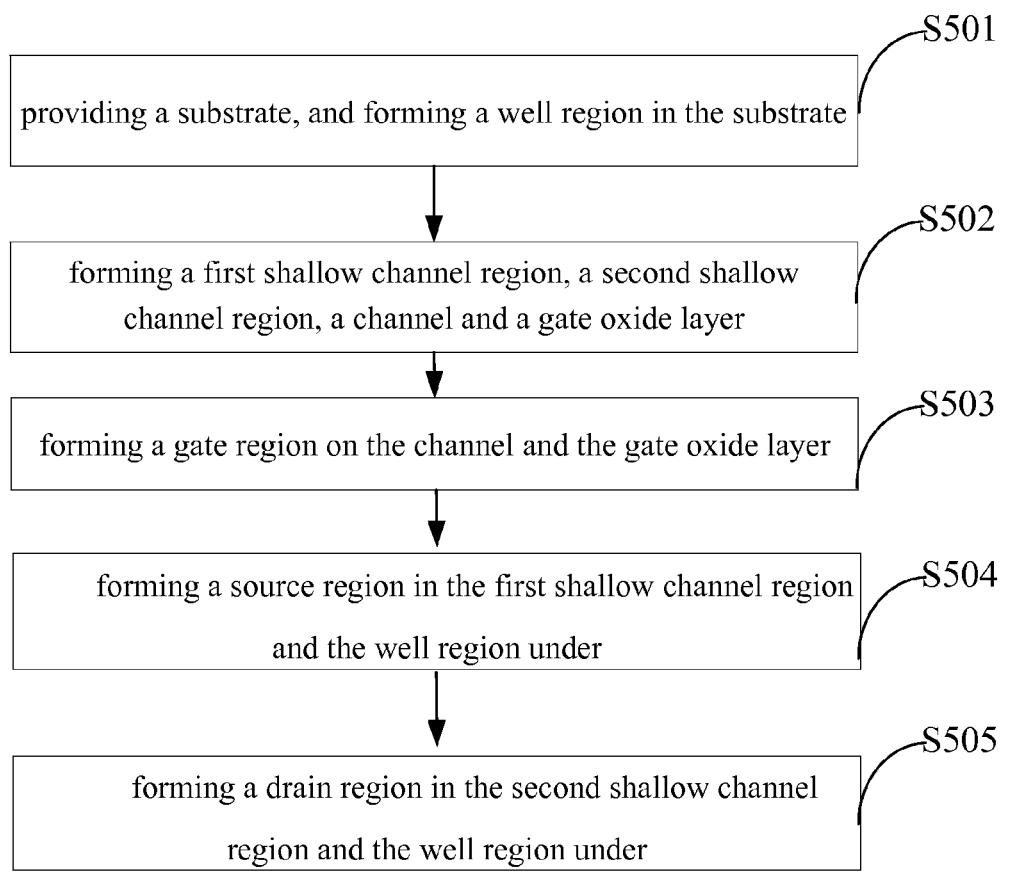
FIG. 5 is a flow chart of a method for manufacturing a MOSFET consistent with the disclosed embodiments.

FIG. 5 illustrates a method for manufacturing a MOSFET with certain structures described above. As shown in FIG. 5, at the beginning, a substrate is provided and a well region is formed in the substrate (S501).

More specifically, after the substrate is provided, a protective oxide layer may be formed on the surface of the substrate by oxidization. The protective oxide layer may be used for preventing the silicon substance from damages during well region implantation and for controlling the impurity implantation depth as a blocking layer. Then, the well region is formed by various steps such as photoresist coating, exposure, developing, and ion implantation. Further, the MOSFET in manufacturing may be an N-channel MOSFET or a P-channel MOSFET and, thus, the well region may be a P-type well by implanting boron ions or an N-type well by implanting phosphorous ions. Other ions may also be used.

Further, a first shallow channel region, a second shallow channel region, a channel and a gate oxide layer are formed on the well region (S502). The first shallow channel region, the second shallow channel region, the channel and the gate oxide layer may be on the same layer level, and the channel connects the first shallow channel region and the second shallow channel region. Other configurations may also be used.

Further, a gate region is formed on the channel and the gate oxide layer (S503). More specifically, a polysilicon layer may be first formed on the surface of the MOSFET by deposition, and a gate pattern may be formed by sequential steps of photoresist coating, exposure and developing. Then, a portion of the polysilicon layer that is outside the gate pattern is removed by corrosion to form the gate region, with the retained portion of the polysilicon layer being the polysilicon gate. Thus, the polysilicon gate (i.e., the gate region) covers the gate oxide layer and the channel between the first shallow channel region and the second shallow channel region. Other gate materials may also be used.

After forming the gate region, a source region is formed in the first shallow channel region and vertically extends into the well region under the first shallow channel region (S504). Also, a drain region is formed in the second shallow channel region and vertically extends into the well region under the second shallow channel region (S505).

The source region and the drain region may be formed using ion implantation. The implantation of doping ions may be performed using a photoresist mask. If the MOSFET is an N-channel MOSFET, the doping ions can be phosphorous ions; if the MOSFET is a P-channel MOSFET, the doping ions can be boron ions. Other doping materials may also be used.

Further, in order to isolate different active regions and prevent leakage current, prior to the forming the well region in the surface of the substrate, isolation regions may be formed in the surface of the substrate. The isolation regions may be shallow trench isolations, with the well region between the shallow trench isolations. Specifically, the shallow trench isolations may be formed by various steps, such as STI trench etching, STI oxide filling, STI oxide layer polishing and nitride layer removal, etc.

Figure 6:
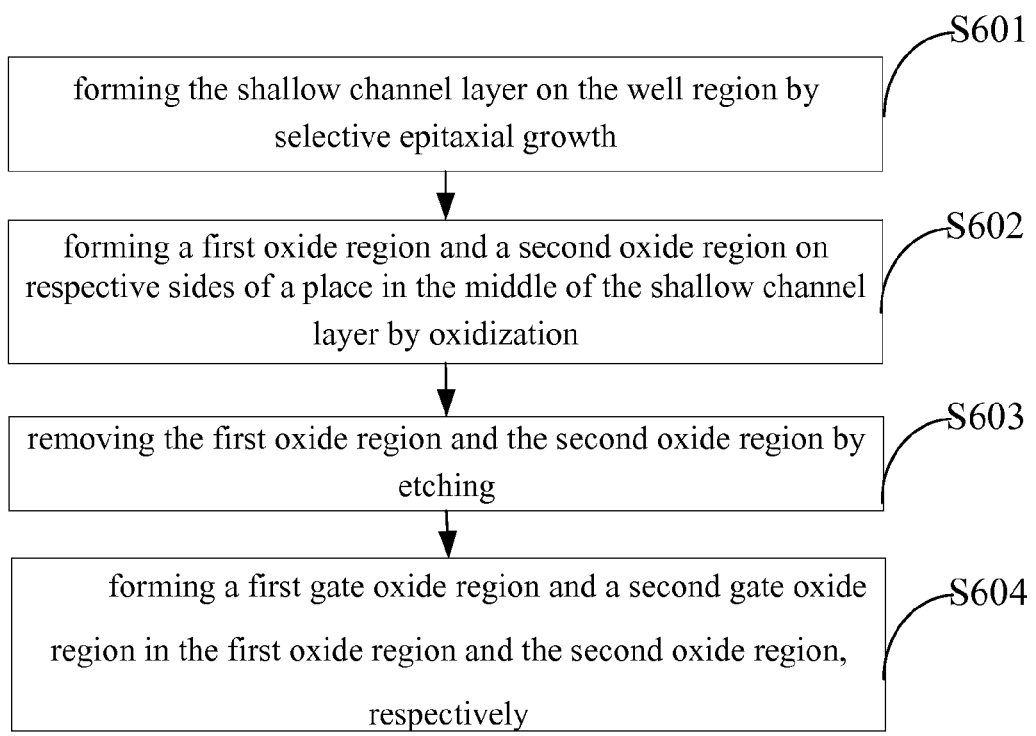
FIG. 6 is a flow chart of another method for manufacturing a MOSFET consistent with the disclosed embodiments.

FIG. 6 illustrates a method for forming the shallow channel layer, the channel, and the gate oxide layer in the MOSFET structures previously described. As shown in FIG. 6, after forming the well region, a shallow channel layer is formed on the well region by selective epitaxial growth (S601). The epitaxy process may include various steps, such as forming a shallow channel layer on the surface of device by epitaxial growth, forming a well region pattern by photolithography, and removing the portion of the shallow channel layer that is outside the well region pattern using the well region pattern as a mask to obtain the pattern of the shallow channel layer. Based on the pattern of the shallow channel layer, the shallow channel layer may be grown by deposition and uniformly doped with carriers so as to accurately control the carrier concentration in the subsequent channel. For example, in sputter deposition, the target may be doped with material such as boron and phosphorous, so as to dope the deposited shallow channel layer.

Further, a first oxide region and a second oxide region are formed on respective sides of the shallow channel layer (S602). The first oxide region and the second oxide region may be formed in certain regions in the middle of the shallow channel layer, such that the shallow channel layer is separated into a first shallow channel region and a second shallow channel region, while a channel formed by the shallow channel layer is retained between the first oxide region and the second oxide region. The channel may be arranged such that one end of the channel connects the first shallow channel region, and the other end of the channel connects the second shallow channel region.

The first oxide region and the second oxide region may be positioned on respective sides in the middle of the shallow channel layer by the processes including photoresist coating, exposure, and developing. The two regions may then be oxidized by wet-oxygen oxidation, with the oxidization depth extending into the well region.

Further, the first oxide layer and the second oxide layer are removed by etching (S603). The shallow channel layer retained between the first oxide layer and the second oxide layer can be used as the conducting channel of the device.

After removing the first oxide layer and the second oxide layer (S603), a first gate oxide region and a second gate oxide region are formed in the first oxide region and the second oxide region, respectively (S604).

To form the gate oxide, a gate oxide layer may be first formed on the surface of the device by dry-oxygen oxidation, and the pattern of the first oxide region and the second oxide region is defined by the processes including photoresist coating, exposure, and developing. Further, the portion of the gate oxide layer that is outside the pattern is removed using the pattern as a mask to obtain the first gate oxide region in the first oxide region and the second gate oxide region in the second oxide region. If the previous etching of the first oxide region and the second oxide region extends into the well region, then the obtained first gate oxide region and second gate oxide region also extend into the well region.

Therefore, a double gate oxide region structure is formed on both sides of the channel longitudinally. Such structure may improve gate control efficiency, reduce leakage current and improve yield rate. Furthermore, as the gate oxide layer extends downwardly into the well region, the problem of decreased breakdown voltage of the gate oxide layer caused by reduced device size can also be solved.

Figure 7:
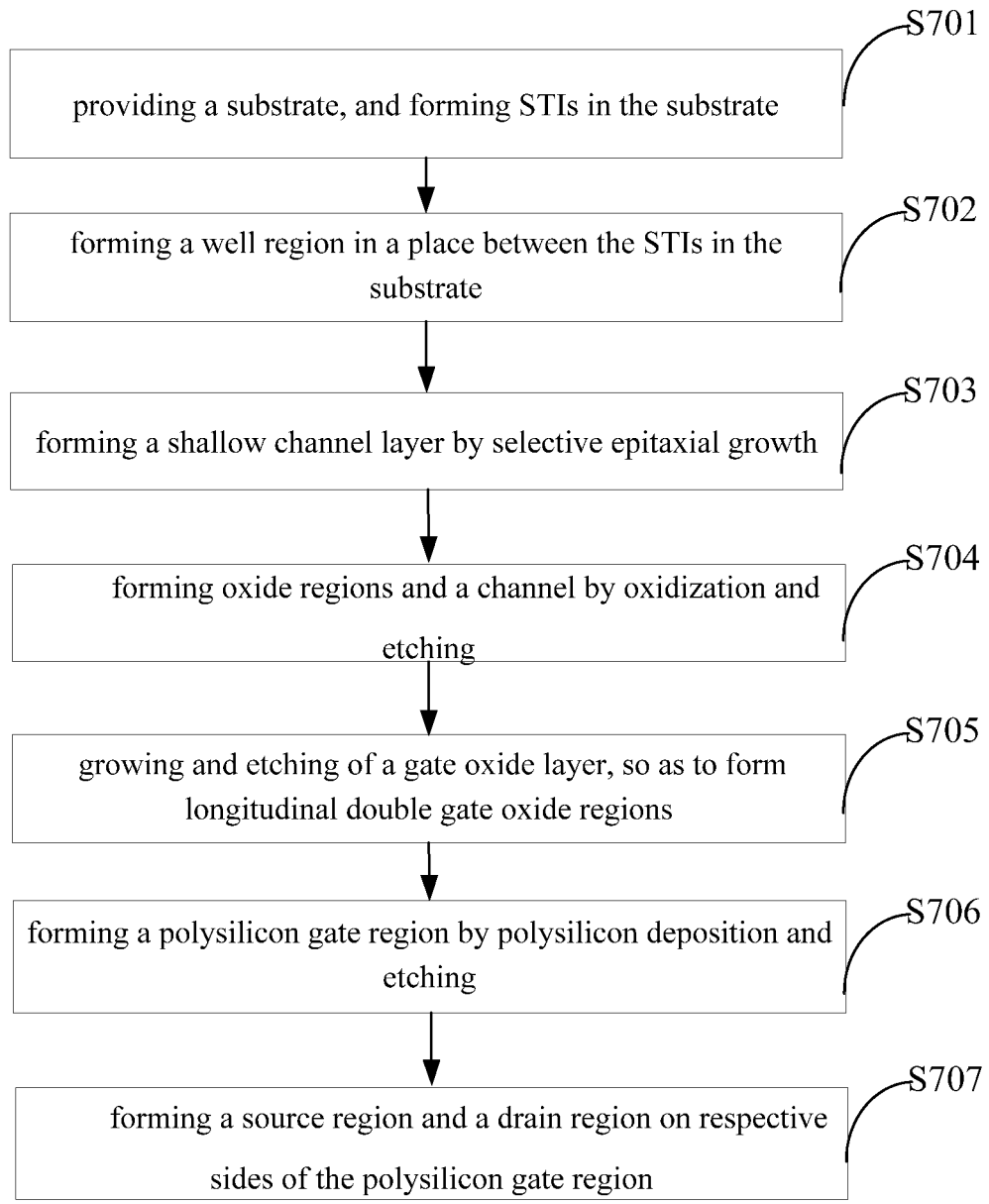
FIG. 7 is a flow chart of another method for manufacturing a MOSFET consistent with the disclosed embodiments.
Figure 8A:
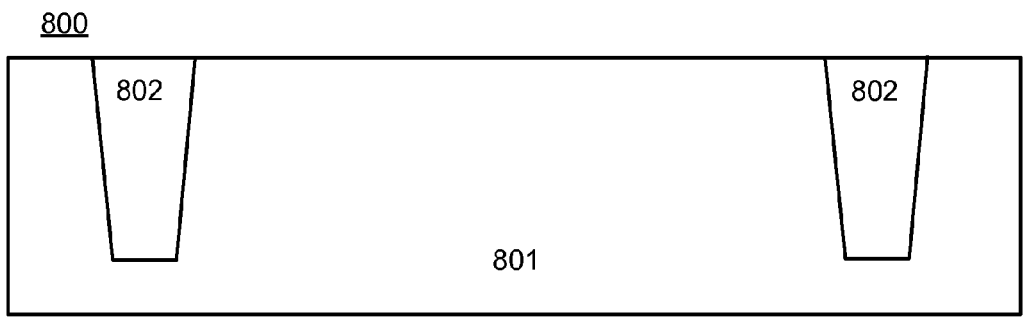
FIGS. 8a-8g illustrate a manufacturing process of a MOSFET consistent with the disclosed embodiments.

FIG. 7 illustrates another method for manufacturing a MOSFET 800, and FIGS. 8a-8g show a corresponding MOSFET 800 after certain individual processes in FIG. 7. As shown in FIG. 7, at the beginning, a substrate 801 is provided and shallow trench isolations 802 are formed in the substrate 801 (S701). FIG. 8a shows MOSFET 800 including the substrate 801 and shallow trench isolations 802.

Figure 8B:
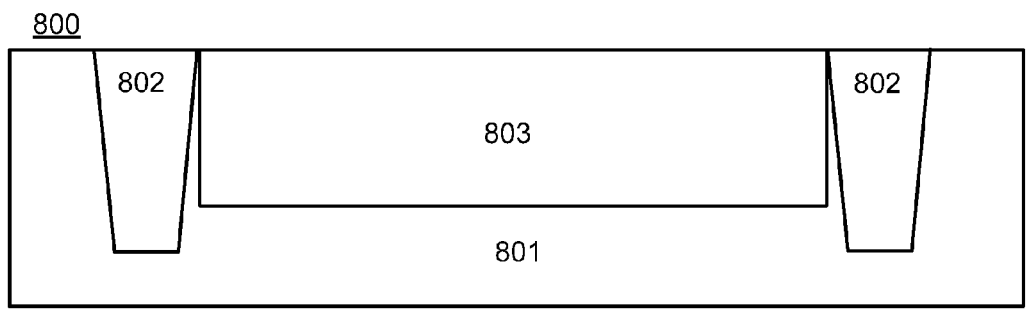

Further, a well region 803 is formed between the shallow trench isolations 802 (S702). FIG. 8b shows well region 803 in the area between the shallow trench isolations 802.

Figure 8C:
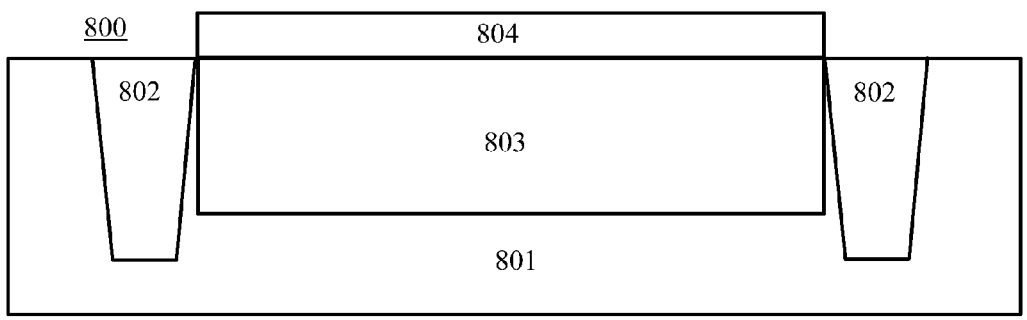

After forming the well region (S702), a shallow channel layer 804 is formed on the surface of the well region 803 (S703). The shallow channel layer 804 may be formed at corresponding region by epitaxial growth or by other processes. FIG. 8c shows shallow channel layer 804 arranged on the surface of the well region 803.

Figure 8D:
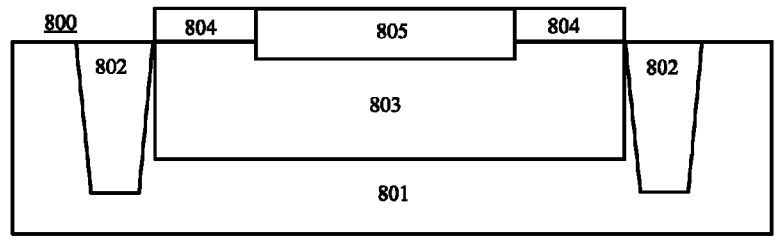
Figure 8E:
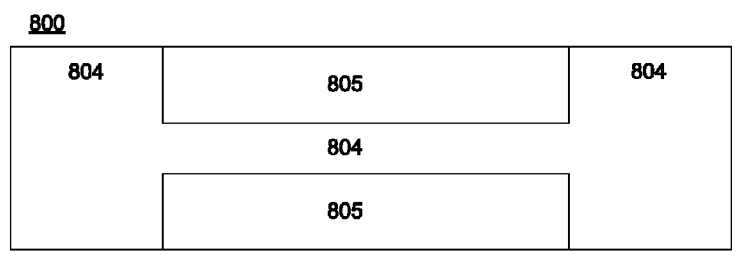

Further, oxide regions 805 and a channel are formed in the shallow channel layer 804 and the well region 803 (S704). The oxide regions 805 may be formed by oxidization and etching. FIG. 8d shows the oxide regions 805 arranged in the shallow channel layer 804 and the well region 803, and FIG. 8e shows the dual oxide regions 805 arranged in the shallow channel layer 804 and a channel is formed between the dual oxide regions 805 to connect a first shallow channel region and a second shallow channel region. Other arrangements may also be used.

Figure 8F:
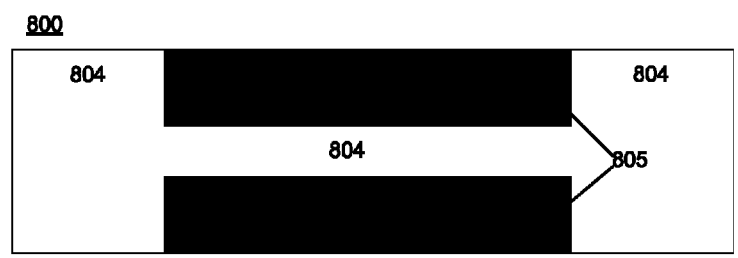

Afterwards, longitudinal double gate oxide regions 805 are formed by growing and etching of a gate oxide layer corresponding to the oxide regions 805 (S705). FIG. 8f shows longitudinal double gate oxide regions 805 in black color.

Figure 8G:
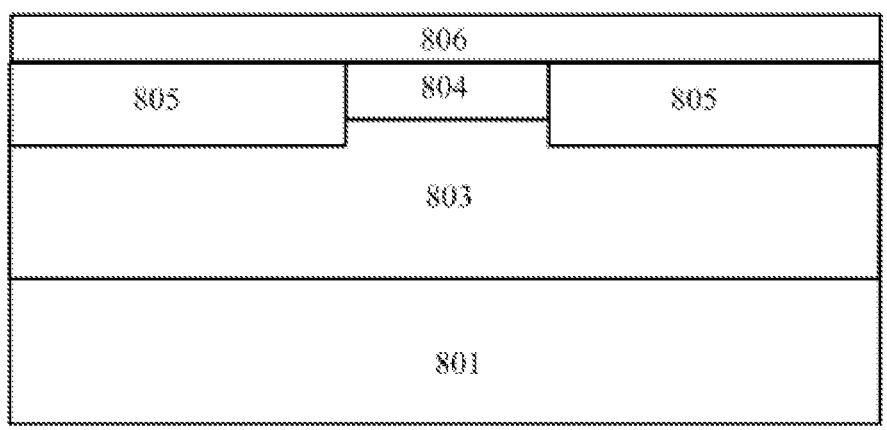

Further, a polysilicon gate region 806 is formed on the surface of MOSFET 800 by polysilicon deposition and etching (S706). FIG. 8g shows polysilicon gate region 806 arranged on the surface of MOSFET 800 covering the channel and the double gate oxide regions 805. Other gate materials may also be used.

After forming the polysilicon gate region 806 (S706), a source region and a drain region are formed on respective sides of the polysilicon gate region (S707). More particularly, the source region and the drain region (not shown) may be formed in the shallow channel regions 804 on respective sides of the polysilicon gate region 806 and the well region 803 under the shallow channel regions, respectively. It is understand that the details of the various processes are similar to those previously described and, therefore, are omitted.

By using the disclosed methods, processes, and devices, more compact and reliable MOSFETs may be provided. For example, a shallow channel layer can be formed by selective epitaxy, and accurate control of the carrier concentration in the channel can be achieved by controlling the doping of the shallow channel layer. Thus, the problem of decreased threshold voltage can be solved. Further, the longitudinal double gate oxide region structure can improve gate control efficiency, reduce leakage current and improve yield rate. Moreover, the MOSFETs are not required to reduce the gate oxide thickness while decreasing device size, which may solve the problem of decreased gate oxide breakdown voltage.

It is understood that the disclosed embodiments may be applied to any semiconductor devices. Various alternations, modifications, or equivalents to the technical solutions of the disclosed embodiments can be obvious to those skilled in the art.

What is claimed is:

1. A Metal-Oxide-Semiconductor Field Effect Transistor (MOSFET), comprising:
   a substrate;
   a well region formed in the substrate;
   a shallow channel layer formed on a portion of the well region and including a first shallow channel region and a second shallow channel region;
   a channel arranged between the first shallow channel region and the second shallow channel region and connecting the first shallow channel region and the second shallow channel region;
   a gate oxide layer formed on a portion of the well region between the first shallow channel region and the second shallow channel region and including a first gate oxide region and a second gate oxide region arranged on different sides of the channel;
   a gate region formed on the channel and the gate oxide layer;
   a source region formed in the first shallow channel region and vertically extending into the well region under the first shallow channel region; and
   a drain region formed in the second shallow channel region and vertically extending into the well region under the second shallow channel region.

2. The MOSFET according to claim 1, wherein:
   the channel is formed on a portion of the well region and on a same layer level as the shallow channel layer.

3. The MOSFET according to claim 2, wherein:
   the gate oxide layer is on the same layer level as both the shallow channel layer and the channel.

4. The MOSFET according to claim 1, wherein:
   the shallow channel layer is formed by deposition and uniformly doped with carriers so as to control the carrier concentration in the channel.

5. The MOSFET according to claim 1, wherein:
   the gate oxide layer is formed on the portion of the well region and partially in the well region to increase a thickness of the gate oxide layer for controlling size of the MOSFET.

6. The MOSFET according to claim 1, wherein:
   the channel connects the source region and the drain region.

7. The MOSFET according to claim 1, wherein:
   the channel and the shallow channel layer are formed by a same epitaxy method.

8. The MOSFET according to claim 7, wherein:
   the epitaxy method includes epitaxial growth, photolithography, and etching.

9. The MOSFET according to claim 1, further including:
   an isolation region formed in the substrate around the well region.

10. The MOSFET according to claim 9, wherein:
    the isolation region is a trench isolation.

11. A method for manufacturing a Metal-Oxide-Semiconductor Field Effect Transistor (MOSFET), comprising:
    providing a substrate;
    forming a well region in the substrate;
    forming a shallow channel layer on a portion of the well region, the shallow channel layer including a first shallow channel region and a second shallow channel region;
    forming a channel between the first shallow channel region and the second shallow channel region, the channel connecting the first shallow channel region and the second shallow channel region;
    forming a gate oxide layer on a portion of the well region between the first shallow channel region and the second shallow channel region, the gate oxide layer including a first gate oxide region and a second gate oxide region arranged on different sides of the channel;
    forming a gate region on the channel and the gate oxide layer;
    forming a source region in the first shallow channel region and the well region under the first shallow channel region; and
    forming a drain region in the second shallow channel region and the well region under the second shallow channel region.

12. The method according to claim 11, wherein forming the channel includes:
    forming the channel is on a portion of the well region and on a same layer level as the shallow channel layer.

13. The method according to claim 12, wherein forming the gate oxide layer includes:
    forming the gate oxide layer on the same layer level as both the shallow channel layer and the channel.

14. The method according to claim 11, wherein forming the shallow channel layer and forming the gate oxide layer include:
    forming the shallow channel layer on the well region by selective epitaxial growth;
    forming a first oxide region and a second oxide region on respective sides in the middle of the shallow channel layer by oxidization, such that the channel formed by the first shallow channel region and the second shallow channel region is retained between the first oxide region and the second oxide region, with one end of the channel connecting the first shallow channel region, and the other end of the channel connecting the second shallow channel region;
    removing the first oxide region and the second oxide region by etching; and
    forming a first gate oxide region and a second gate oxide region in the first oxide region and the second oxide region, respectively, as the gate oxide layer.

15. The method according to claim 11, further including:
    before forming the well region, forming shallow trench isolations in the surface of the substrate, such that the well region is formed between the shallow trench isolations.

16. The method according to claim 11, wherein forming the shallow channel layer includes:
    forming the shallow channel layer by deposition and uniformly doped with carriers so as to control the carrier concentration in the channel.

17. The method according to claim 11, wherein forming the gate oxide layer includes:
    forming the gate oxide layer on the portion of the well region and partially in the well region to increase a thickness of the gate oxide layer for controlling size of the MOSFET.

* * * * *